United States Patent
Shi et al.

(10) Patent No.: US 8,134,208 B2
(45) Date of Patent: Mar. 13, 2012

(54) SEMICONDUCTOR DEVICE HAVING DECREASED CONTACT RESISTANCE

(75) Inventors: Zhonghai Shi, Austin, TX (US); David Wu, Austin, TX (US); Mark Michael, Cedar Park, TX (US); Donna Michael, legal representative, Cedar Park, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 476 days.

(21) Appl. No.: 11/861,928

(22) Filed: Sep. 26, 2007

(65) Prior Publication Data

US 2009/0078998 A1 Mar. 26, 2009

(51) Int. Cl.
*H01L 27/12* (2006.01)
(52) U.S. Cl. .......... 257/347; 438/151; 257/E27.112
(58) Field of Classification Search ........ 257/347, 257/377, 382, E27.112; 438/682, 683, 149
See application file for complete search history.

(56) References Cited

U.S. PATENT DOCUMENTS

| | | | | |
|---|---|---|---|---|
| 6,133,105 A | * | 10/2000 | Chen et al. | 438/296 |
| 6,413,829 B1 | * | 7/2002 | Yu | 438/311 |
| 7,105,894 B2 | * | 9/2006 | Yeo et al. | 257/347 |
| 2004/0007745 A1 | * | 1/2004 | Iinuma | 257/382 |
| 2005/0045949 A1 | * | 3/2005 | Lin et al. | 257/347 |
| 2005/0145938 A1 | * | 7/2005 | Lin | 257/347 |
| 2007/0001219 A1 | * | 1/2007 | Radosavljevic et al. | 257/327 |
| 2007/0267753 A1 | * | 11/2007 | Luo et al. | 257/773 |

* cited by examiner

*Primary Examiner* — Kiesha Bryant
*Assistant Examiner* — Mark Tornow
(74) *Attorney, Agent, or Firm* — Ingrassia Fisher & Lorenz, P.C.

(57) ABSTRACT

Semiconductor devices having improved contact resistance and methods for fabricating such semiconductor devices are provided. These semiconductor devices include a semiconductor device structure and a contact. The contact is electrically and physically coupled to the semiconductor device structure at both a surface portion and a sidewall portion of the semiconductor device structure.

5 Claims, 8 Drawing Sheets

SEMICONDUCTOR DEVICE HAVING DECREASED CONTACT RESISTANCE

TECHNICAL FIELD

The present invention generally relates to semiconductor devices and methods for fabricating them, and more particularly relates to semiconductor device structures having conductive contacts and methods for fabricating such semiconductor device structures.

BACKGROUND

Semiconductor devices, such as semiconductor integrated circuits (ICs), include numerous semiconductor device structures, such as interconnected complementary metal oxide semiconductor (CMOS) transistors (i.e. both P-channel and N-channel MOS transistors). Interconnectivity between various device structures on ICs is accomplished by metallized contacts forming interlayer connections between the device structures. With the increase in the number of semiconductor device structures in ICs, it becomes important to shrink the size of individual device structures and maintain manufacturability.

Semiconductor device structures, such as CMOS transistors, have now been designed to have feature sizes (e.g., gate electrodes) less than or equal to forty-five nanometers in width. However, as the size of semiconductor device structures shrink, the size of the contacts decrease. Reduction in the size of the contacts also reduces the contact area between these contacts and the devices structures, thereby increasing the resistance therebetween.

Accordingly, it is desirable to provide semiconductor devices having reduced contact resistance and a method for fabricating such semiconductor devices. Furthermore, other desirable features and characteristics of the present invention will become apparent from the subsequent detailed description of the invention and the appended claims, taken in conjunction with the accompanying drawings and this background of the invention.

BRIEF SUMMARY

Methods are provided for fabricating semiconductor devices having improved contact resistance. One such method includes the steps of forming a semiconductor device structure and depositing dielectric material to form an interlayer dielectric (ILD) layer over the semiconductor device structure. The method further includes the step of selectively etching an opening through the ILD layer, the opening including a first portion having a first depth and a second portion having a second depth. Finally the method includes the step of filling the opening with conductive material to form a contact, the contact being electrically and physically coupled to the semiconductor structure at a sidewall portion thereof in the first portion of the opening and electrically and physically coupled to the semiconductor structure at a surface portion thereof in the second portion of the opening.

Semiconductor devices having improved contact resistance are also provided. These semiconductor devices include a semiconductor device structure and a contact. The contact is electrically and physically coupled to the semiconductor device structure at both a surface portion and a sidewall portion of the semiconductor device structure.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
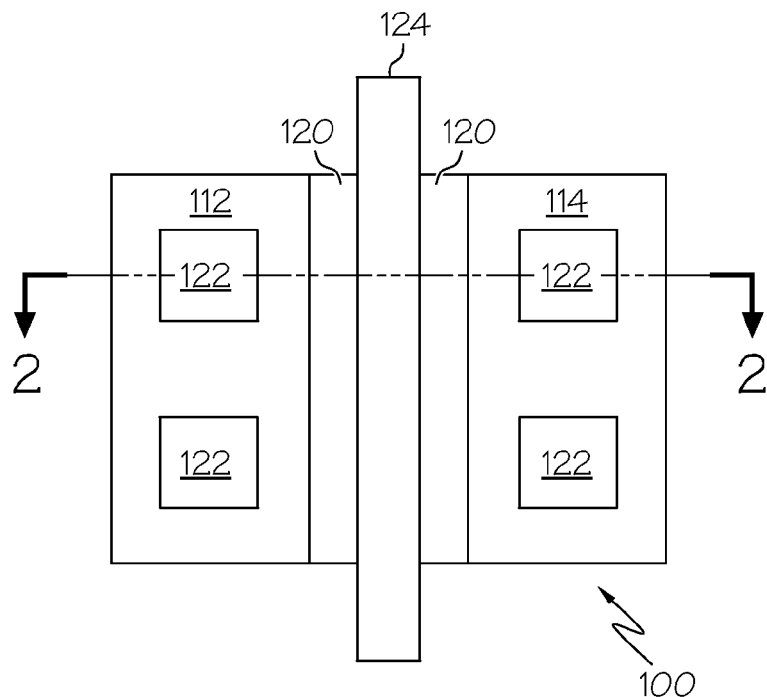
FIG. 1 is a plan view of a first conventional semiconductor transistor structure.
Figure 2:
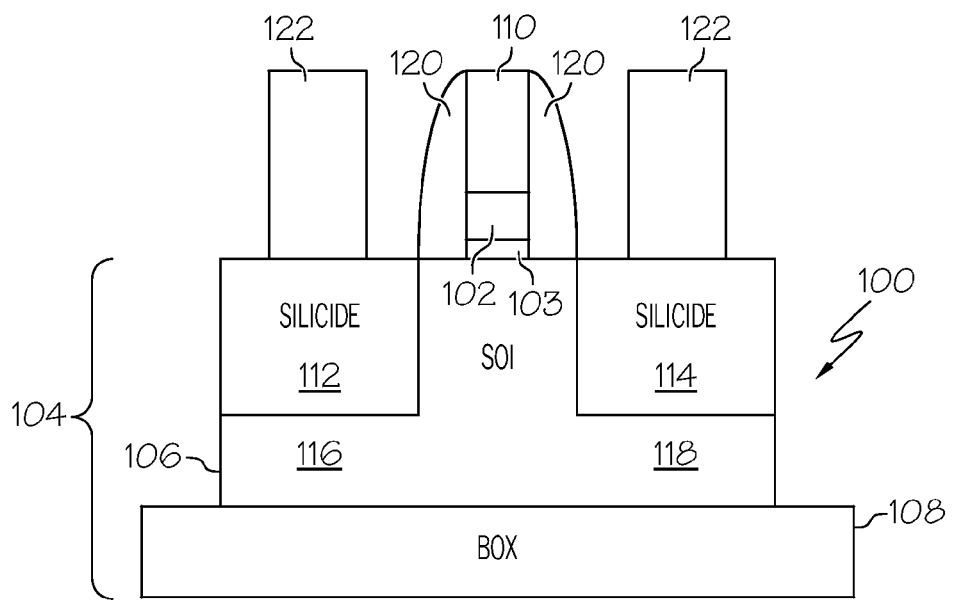
FIG. 2 is a cross-sectional view of the first semiconductor transistor structure of FIG. 1.

Referring to FIGS. 1 and 2, a plan view of a conventional semiconductor transistor structure 100 is shown in FIG. 1 and a cross-sectional view of the semiconductor transistor structure of FIG. 1 across line 2-2 is shown in FIG. 2, both views not including interlayer dielectric (ILD) material to better show the structure 100. The semiconductor transistor structure 100 includes a gate 102 formed on a silicon on insulator (SOI) substrate 104 having a layer of SOI material 106 overlying a buried oxide layer (BOX) 108. The gate 102 is separated from the SOI material 106 by a gate oxide layer 103. Silicide material 110, 112 and 114 has been deposited onto the structure 100 during fabrication to form a first silicide region 110 over the gate 102, a second silicide region 112 over a drain region 116 in the SOI material layer 106, and a third silicide region 114 over a source region 118 in the SOI material layer 106. Insulative spacers 120 are formed on either side of the gate 102, silicide 110 stack to provide horizontal insulation therefore. Contacts 122 are formed through the ILD layer (not shown) such that they are physically connected to the silicide regions 112, 114 to provide an electrical connection through the ILD layer to the drain region 116 and the source region 118. Another contact 124 is physically connected to the silicide region 110 to provide an electrical connection to the gate 102 through the ILD layer.

As can clearly be seen in the cross-sectional view of FIG. 2, the physical and electrical coupling of the contacts 122 to the drain region 116 and the source region 118 is provided in the surface area connection of the contacts 122 to the silicide regions 112, 114. As the size of semiconductor device structures shrink, the size of the contacts 122 decrease, thereby reducing the surface area connection (i.e., the contact area) between the contacts 122 and the silicide material in the regions 112, 114. This reduction in the contact area increases the resistance provided by the contacts 122, detrimentally adding increased resistance to signals flowing through the transistor device structure 100.

Figure 3:
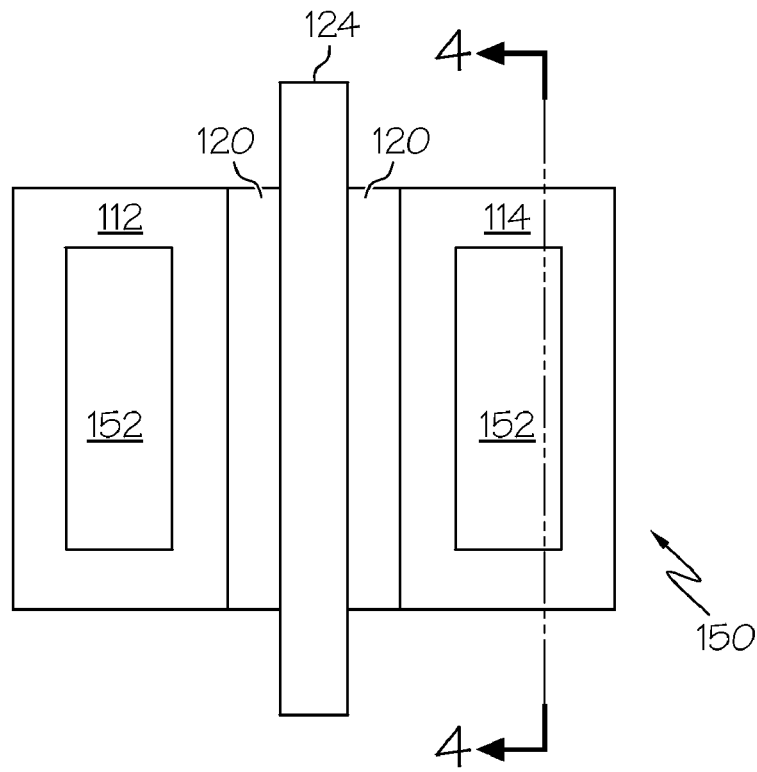
FIG. 3 is a plan view of a second conventional semiconductor transistor structure.
Figure 4:
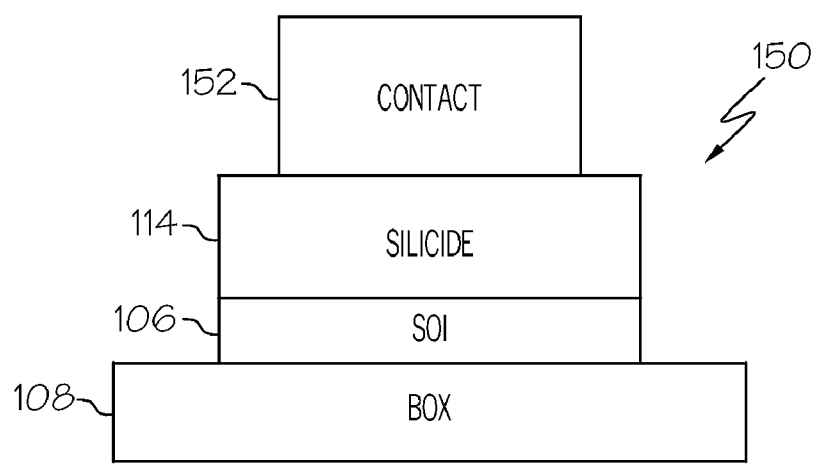
FIG. 4 is a cross-sectional view of the second semiconductor transistor structure of FIG. 3.

Referring to FIGS. 3 and 4, a plan view of a conventional semiconductor transistor structure 150 is shown in FIG. 3 and a cross-sectional view of the semiconductor transistor structure of FIG. 3 across line 4-4 is shown in FIG. 4, both views not including interlayer dielectric (ILD) material to better show the structure 150. The semiconductor transistor structure 150 is similarly constructed to the semiconductor transistor structure 100 of FIGS. 1 and 2, except that contacts 152 are enlarged to provide greater contact area. As can clearly be seen in the cross-sectional view of FIG. 4, even though the size of the contacts 152 is increased, providing more contact area with the silicide regions 112, 114, the physical and electrical coupling of the contacts 152 to the drain region 116 and the source region 118 is still limited to the surface area connection of the contacts 152 to the silicide regions 112, 114. As the size of semiconductor device structures shrink, the size of these larger contacts 152 will also decrease, thereby reducing the contact area between the contacts 152 and the silicide material in the regions 112, 114 and increasing the resistance provided by the contacts 152.

Figure 5:
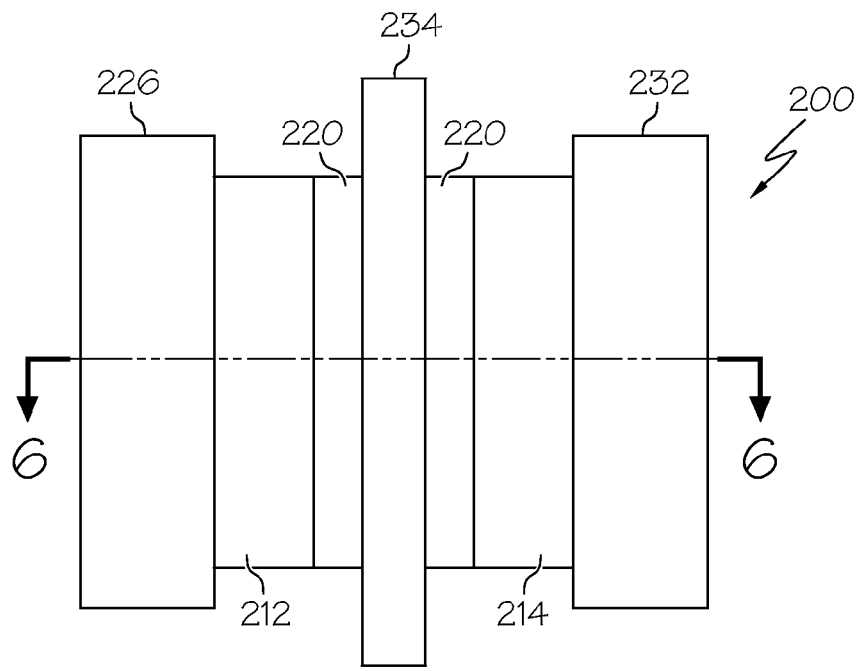
FIG. 5 is a plan view of a semiconductor transistor structure in accordance with a first embodiment of the present disclosure.
Figure 6:
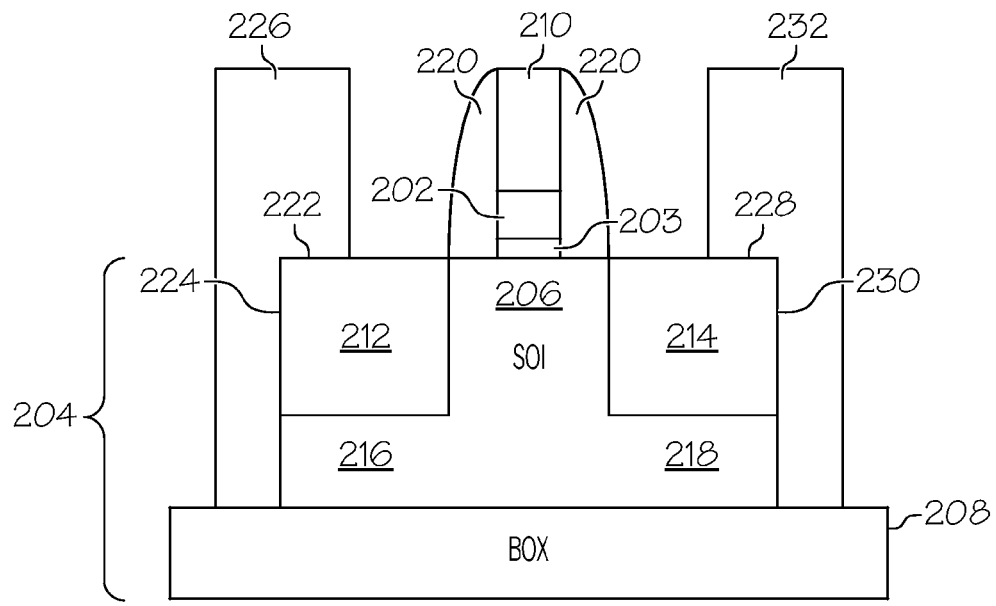
FIG. 6 is a cross-sectional view of the semiconductor transistor structure of FIG. 5 in accordance with the first embodiment of the present disclosure.

FIG. 5 is a plan view of a semiconductor transistor structure 200 in accordance with a first embodiment of the present disclosure and FIG. 6 is a cross-sectional view of the semiconductor transistor structure 200 across line 6-6 in accordance with the first embodiment of the present disclosure. The semiconductor transistor structure 200 provides improved contact resistance by reducing such resistance as described hereinbelow.

The semiconductor transistor structure 200 includes a gate 202 formed on a silicon on insulator (SOI) substrate 204 having a layer of SOI material 206 overlying a buried oxide layer (BOX) 208, the gate 202 being separated from the SOI material by a gate oxide layer 203. Silicide material 210, 212 and 214 has been deposited onto the structure 200 during fabrication to form a first silicide region 210 over the gate 202, a second silicide region 212 over a drain region 216 in the SOI material layer 206, and a third silicide region 214 over a source region 218 in the SOI material layer 206. Insulative spacers 220 are formed on either side of the gate 202 and silicide 210 stack to provide horizontal insulation.

The second silicide region 212 has both a surface portion 222 and a sidewall portion 224 for physically and electrically connecting to contact 226. In a similar manner, the third silicide region 214 has both a surface portion 228 and a sidewall portion 230 for physically and electrically connecting to contact 232. Thus, the contacts 226, 232 are formed through the ILD layer (not shown) in accordance with this first embodiment such that they are physically connected to the silicide regions 212, 214 at both the surface portions 222, 228 and the sidewall portions 224, 230 to provide an electrical coupling through the ILD layer to the drain region 216 and the source region 218. Another contact 234 is physically connected to the silicide region 210 to provide an electrical coupling to the gate 202 through the ILD layer.

As can clearly be seen in the cross-sectional view of FIG. 6, the physical and electrical connection of the contacts 226, 232 to the silicide regions 212, 214 is provided in accordance with this first embodiment at both the surface portions 222, 228 and the sidewall portions 224, 230, thereby providing increased contact area therebetween without increasing the size of the contacts 226, 232. The increased contact area advantageously reduces the resistance of the contacts 226, 232.

FIGS. 7 to 16 schematically illustrate method steps for the manufacture of a CMOS integrated circuit in accordance with the first embodiment of the disclosure which includes the semiconductor structure 200. Various steps in the manufacture of CMOS devices are well known and so, in the interest of brevity, many conventional steps will only be mentioned briefly herein or will be omitted entirely without providing the well known process details.

Figure 7:
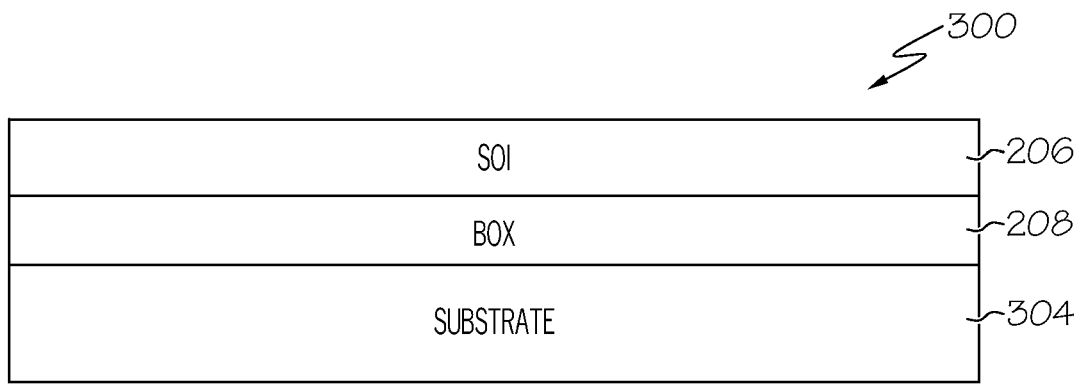
FIGS. 7 to 16 are cross-sectional views schematically illustrating method steps for fabrication of a semiconductor transistor structure in accordance with the first embodiment of the disclosure.

Referring to FIG. 7, the method in accordance with this first embodiment of the invention begins with providing silicon on insulator (SOI) semiconductor material including the SOI layer 206 and a substrate layer 304 separated by the insulator layer 208. The SOI semiconductor layer 206 is initially provided as a layer of SOI material, preferably a monocrystalline silicon layer. The substrate layer 304 is preferably a monocrystalline silicon carrier substrate. As used herein, the terms "monocrystalline silicon layer" and "monocrystalline silicon carrier substrate" will be used to encompass the relatively pure monocrystalline silicon materials typically used in the semiconductor industry as well as silicon admixed with other elements such as germanium, carbon, and the like to form substantially monocrystalline semiconductor material.

The structure 206, 208, 304 can be formed, for example, by the well known layer transfer technique. In that technique hydrogen is implanted into a subsurface region of an oxidized monocrystalline silicon wafer. The implanted wafer, i.e., the SOI layer 206, is then flip bonded to the substrate 304. A two phase heat treatment is then carried out to split the hydrogen implanted wafer along the implanted region and to strengthen the bonding, leaving the SOI layer 206, a thin monocrystalline silicon layer, bonded to the monocrystalline silicon substrate 304 and separated therefrom by the insulating layer 208, a layer of dielectric insulating material commonly referred to as the buried oxide (BOX) layer 208.

Prior to providing for fabrication in accordance with the first embodiment of this disclosure, the SOI layer 206 is preferably thinned and polished, for example by chemical mechanical planarization (CMP) techniques, to a thickness of about 50-300 nanometers (nm) depending on the circuit function being implemented. Both the SOI layer 206 and the substrate 304 preferably have a resistivity of at least about 1-35 Ohms-centimeter. The substrate 304 may be impurity doped P-type. The BOX layer 208, typically silicon dioxide, preferably has a thickness of about 50-200 nm.

Figure 8:
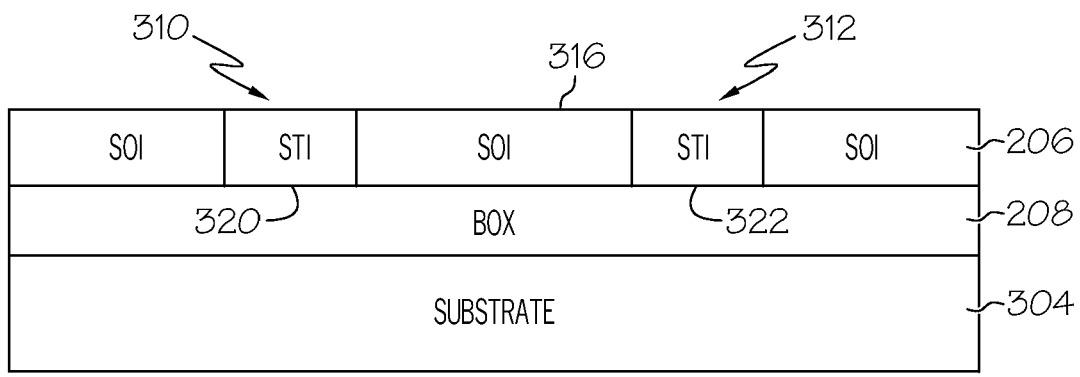

Having provided the semiconductor substrate, the fabrication method in accordance with the embodiment of this disclosure continues as illustrated in FIG. 8 by the formation of dielectric isolation regions 310, 312 extending through the SOI substrate 206 to the BOX layer 208. The dielectric isolation regions are preferably formed by the well known shallow trench isolation (STI) technique in which, as shown in FIG. 8, trenches, such as first opening 310 and second opening 312, are etched into the SOI substrate 206 adjacent to and on either side of a SOI pillar 316 to remove portions of the SOI material in SOI layer 206. The openings 310 and 312 are then filled with a dielectric material such as a deposited silicon oxide or a deposited nitride to form STI regions 320, 322 separated by the SOI pillar 316. After the trenches 310, 312 are filled with the STI material to form STI regions 320, 322, the excess STI material may be removed by CMP.

Figure 9:
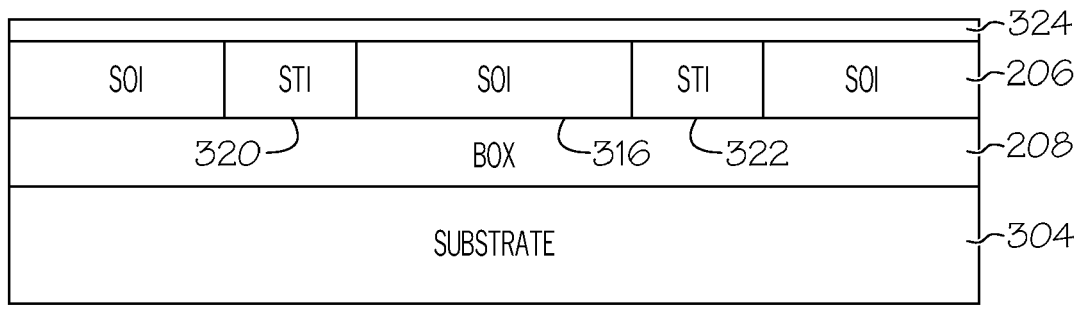
Figure 10:
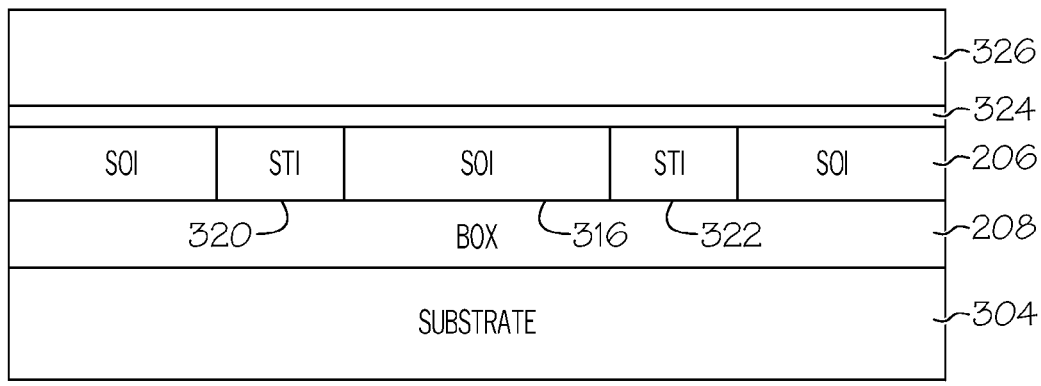
Figure 11:
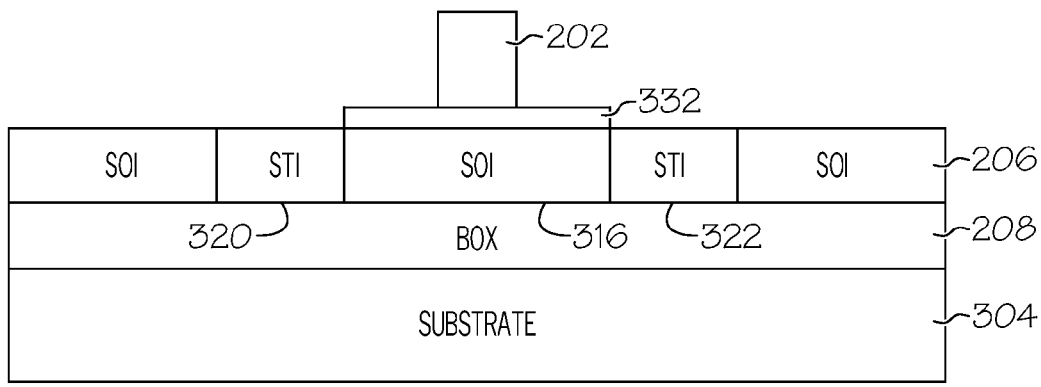

Referring to FIG. 9, the STI regions 320, 322 provide electrical isolation, as needed for the semiconductor transistor structure 200 being formed on the SOI pillar 316. Also depicted in FIG. 9 is a gate oxide layer 324 which is formed on the SOI substrate 206 by thermally growing or depositing a layer of insulative oxide material 324 on the SOI substrate 206 in a manner well known to those skilled in the art. Next, a semiconductive material such as polysilicon or metal is deposited as a gate layer 326, as depicted in FIG. 10, and gate etch is performed to create the gate 202 on a layer of gate oxide 332 on the SOI pillar 316 as shown in FIG. 11.

Figure 12:
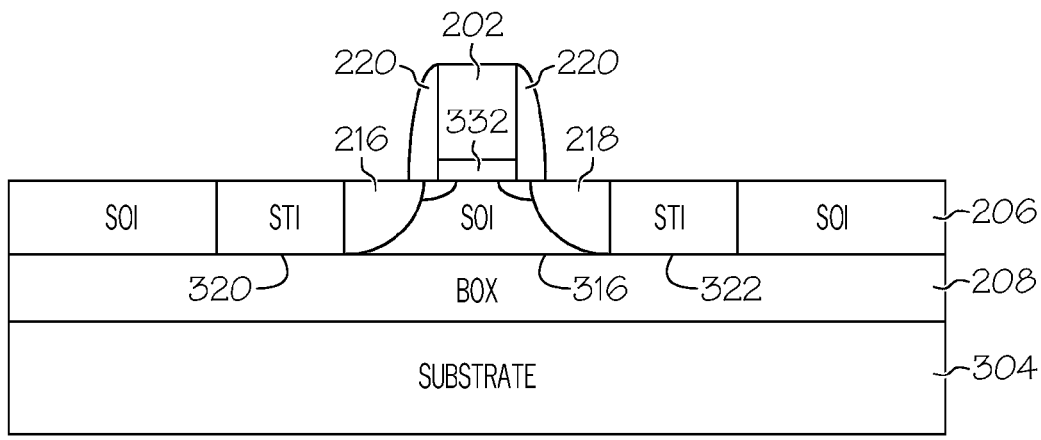

The spacers 220 are then formed in a manner well-known to those skilled in the art to provide insulation for the gate 202 and self-alignment for deep source/drain implant. Thus, the semiconductor transistor structure 200, shown in FIG. 12, is formed, this semiconductor device structure 200 being utilized along with an ion implantation mask to dope the regions 216, 218 by ion implantation of, for example, n-type impurity dopant ions, preferably arsenic ions, to form a source in region 216 and a drain in region 218 where the SOI layer 206 is a p-type semiconductor substrate (i.e., doped with p-type ions).

Figure 13:
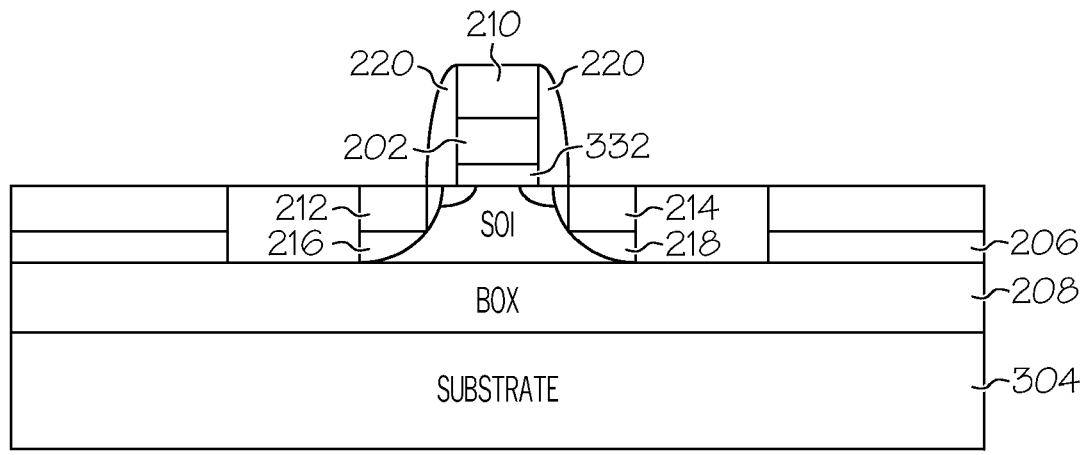

Referring to FIG. 13, a layer of silicide forming metal such as nickel, cobalt, titanium, palladium, or the like is deposited across the structure 200 and annealed to form silicide regions 212, 214 within the source and drain regions 216, 218 and silicide region 210 within the gate 202. As is well-known to those skilled in the art, the silicide forming metal layer may have a thickness of about 5 nm to 15 nm and is heated for annealing, preferably to a temperature of about 350° C. to 500° C., thereby causing the metal of the silicide layer to react with the polysilicon in the gate 202 and the silicon in the regions 216, 218 to form the metal silicide contact regions 210, 212, 214 as illustrated in FIG. 13. After annealing, the unreacted metal is removed.

Figure 14:
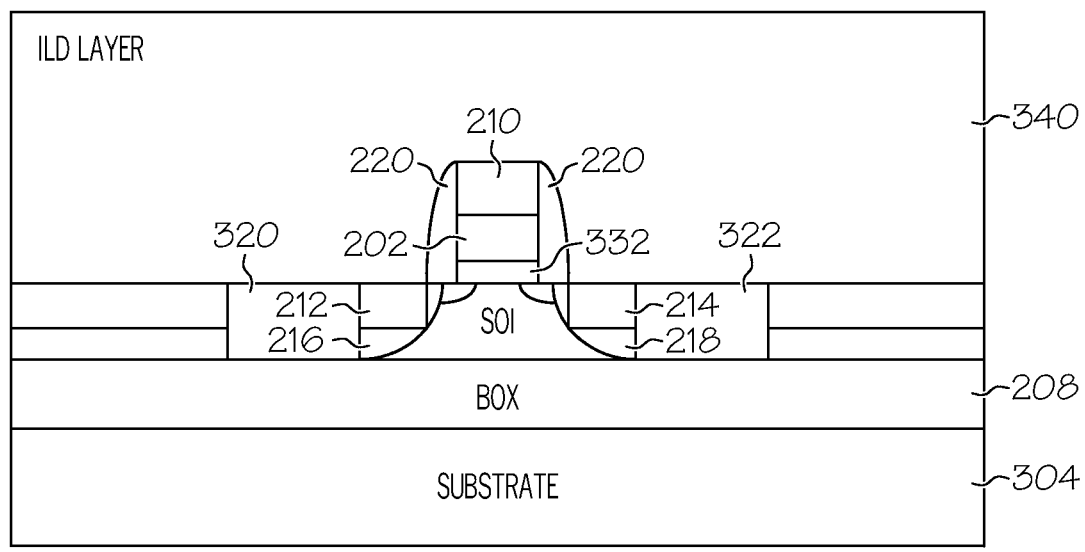

Referring to FIG. 14 a layer 340 of insulating interlayer dielectric (ILD) material is deposited and planarized to cover the metal silicide contact regions 210, 212, 214 and the spacers 220 (as well as the silicide layers above other portions of the SOI layer 302). The insulating ILD material can be deposited, for example, by low pressure chemical vapor deposition using a tetraethylorthosilicate (TEOS) source. The ILD layer 340 is preferably planarized by CMP.

Figure 15:
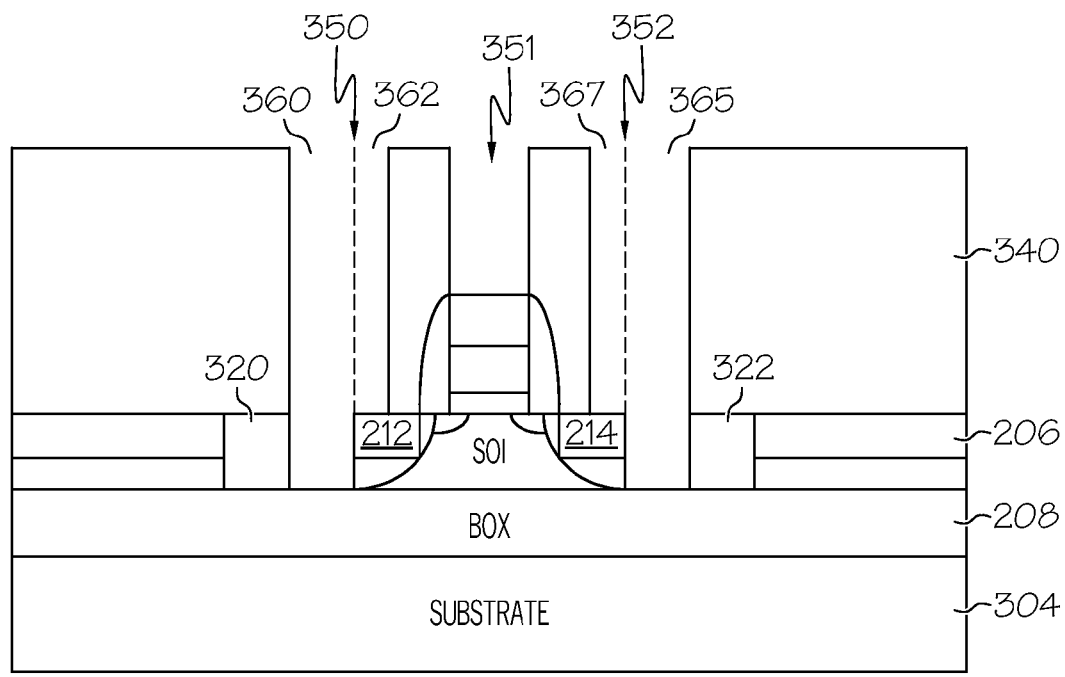

Following the planarization, a layer of photoresist (not illustrated) is applied to the surface of the planarized insulating material and is patterned for use as an etch mask to selectively etch contact openings 350, 351, 352 shown in FIG. 15, where opening 350 is located partially over the STI material 320 and the silicide region 212 and the opening 352 is located partially over the STI material 322 and the silicide region 214. The selective etching is defined such that ILD material and STI material will be etched away while metal silicide regions will not be etched. Thus, as shown in FIG. 15, openings 350, 351, 352 extend through the ILD material 340 to the metal silicide contact regions 210, 212, 214 of the semiconductor transistor structure 200 where the opening 350 includes a first portion 360 having a first depth defined by the depth of the etch through the ILD material 340 and the STI material of STI region 320 and a second portion 362 having a second depth defined by the depth of the etch through the ILD material 340. Similarly, the opening 352 includes a first portion 365 having a first depth defined by the depth of the etch through the ILD material 340 and the STI material of STI region 322 and a second portion 367 having a second depth defined by the depth of the etch through the ILD material 340. The first portions 360, 365 of the openings 350, 352 expose sidewall portions of the semiconductor transistor structure 200, specifically sidewall portions of the metal silicide regions 212, 214 and the SOI material of the source and drain regions 216, 218. The second portions 362, 367 of the openings 350, 352 expose surface portions of the semiconductor transistor structure 200, specifically surface portions of the metal silicide regions 212, 214.

Figure 16:
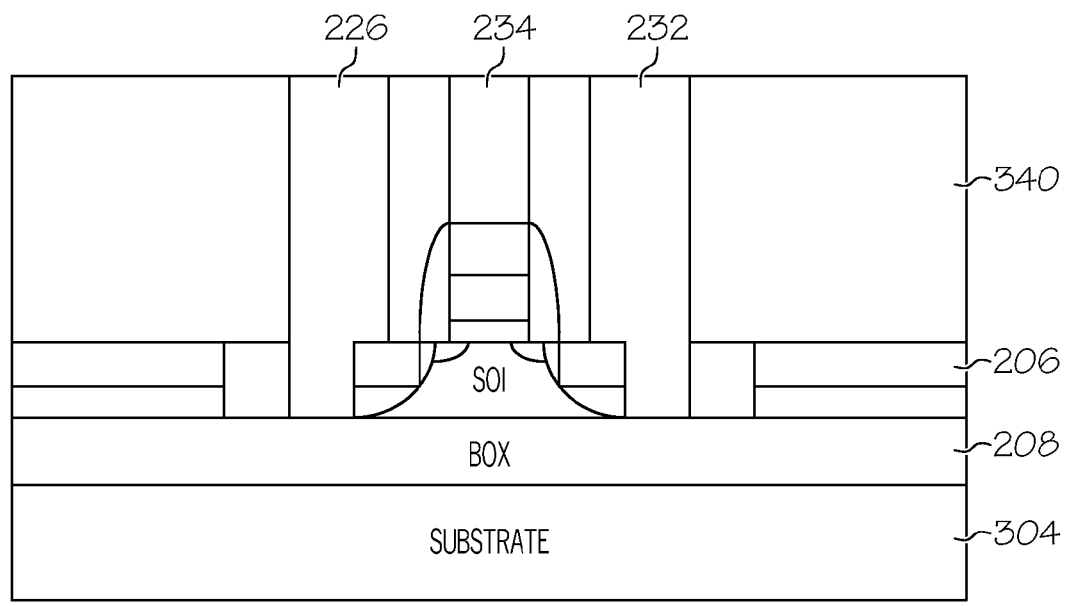

Contacts 226, 234, 232 are formed in each of contact openings 350, 351, 352 to allow electrical contact to the source, drain and gate regions 216, 218, 202. The contacts can be formed, for example, by depositing successive layers of titanium, titanium nitride, and tungsten in a known manner. The excess titanium, titanium nitride and tungsten layers can then be removed by CMP to leave contacts 226, 234, 232 as illustrated in FIG. 16.

Those of skill in the art will appreciate that alternative and/or additional steps may be used to fabricate the semiconductor transistor structure 200 or other semiconductor device structures in accordance with this first embodiment and the order of the method steps may be changed without departing from the broad scope of the invention.

Figure 17:
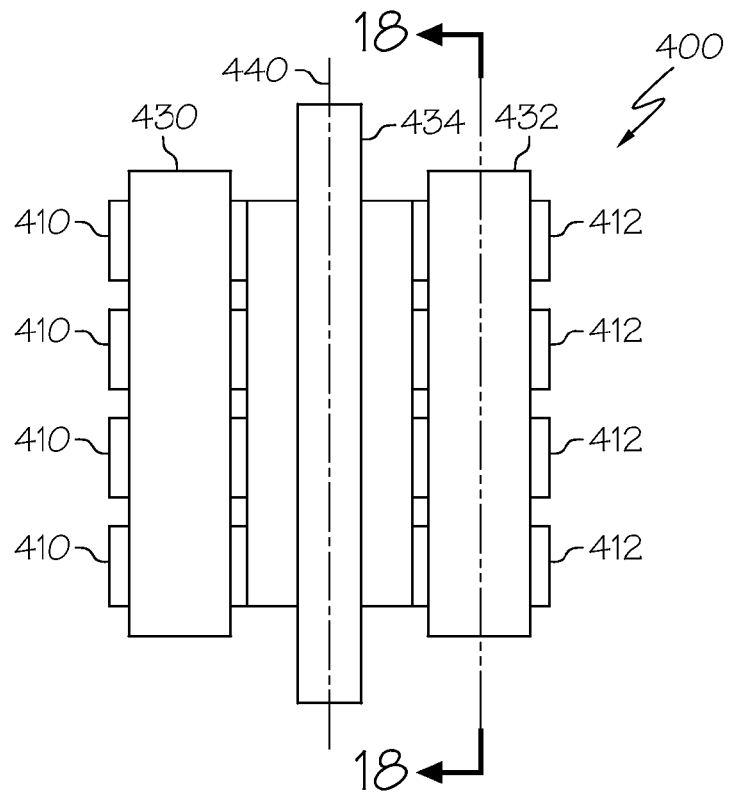
FIG. 17 is a plan view of a semiconductor structure in accordance with a second embodiment of the present disclosure.
Figure 18:
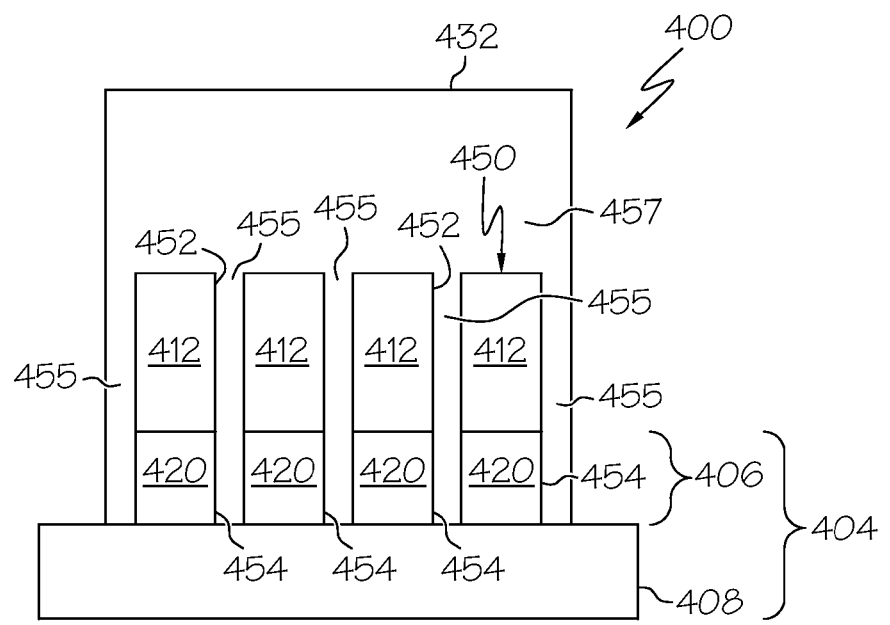
FIG. 18 is a cross-sectional view of the semiconductor structure of FIG. 17 in accordance with the second embodiment of the present disclosure.

In accordance with a second embodiment of the present disclosure, FIG. 17 is a plan view of a semiconductor transistor structure 400 in accordance with this second embodiment and FIG. 18 is a cross-sectional view of the semiconductor transistor structure 400 across line 18-18 in accordance with this second embodiment. The semiconductor transistor structure 400 provides reduced contact resistance as described hereinbelow.

The semiconductor transistor structure 400 includes a gate (not shown) formed on a silicon on insulator (SOI) substrate 404 having a layer of SOI material 406 overlying a buried oxide layer (BOX) 408. Silicide material has been deposited onto the structure 400 during fabrication to form silicide regions 410 over a source region (not shown) in the SOI material layer 406, silicide regions 412 over a drain region 420 in the SOI material layer 406, and a silicide region 414 over the gate. Each of contacts 430, 432, 434 are formed parallel to a longitudinal axis 440 of the semiconductor transistor structure 400.

Multiple trenches have been etched in the silicide regions 410, 412 and the source region and the drain region 420 in a direction substantially perpendicular to the longitudinal axis 440 to expose multiple surface portions 450 and multiple sidewall portions 452 of the silicide regions 410, 412 and multiple sidewall portions 454 of the source region and the drain region 420 for physically and electrically connecting to contact fingers 455 of the contacts 430, 432. Thus, the contacts 430, 432 are formed through the ILD layer (not shown) in accordance with this second embodiment such that the contact fingers 455 physically and electrically connect to the silicide regions 410, 412 at multiple sidewall portions 452 and intermediate portions 457 of the contacts 430, 432 between the contact fingers 455 physically and electrically connect to the silicide regions 410, 412 at multiple surface portions 450 to provide an electrical coupling through the ILD layer to the source region and the drain region 420.

As can clearly be seen in the cross-sectional view of FIG. 18, the physical and electrical connection of the contacts 430, 432 to the silicide regions 410, 412 is provided in accordance with this second embodiment through the contact fingers 455 and portions 457 intermediate therebetween to both the sidewall portions 452 and the surface portions 450 of the contacts 430, 432 thereby greatly increasing contact area of the contacts 430, 432 without increasing the size of the contacts 430, 432. The increased contact area advantageously reduces the resistance of the contacts 430, 432.

Thus it can be seen that semiconductor device and methods for fabricating such semiconductor devices have been provided that significantly reduce contact resistance, thereby improving the resistance of the semiconductor device. While exemplary embodiments have been presented in the foregoing detailed description of the invention, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A semiconductor device comprising:
a semiconductor device structure comprising:
   a silicide portion having a top silicide surface and an outer sidewall silicide surface; and
   a semiconductor region of a silicon on insulator (SOI) substrate overlying a buried oxide layer of the SOI substrate, the semiconductor region having an outer sidewall semiconductor surface that is common to and continuous with the outer sidewall silicide surface; and
an electrically conductive contact, wherein the contact is electrically connected directly to the top silicide surface, is in direct physical contact with the top silicide surface, is electrically connected directly to the outer sidewall silicide surface, is in direct physical contact with the outer sidewall silicide surface, is electrically connected directly to the outer sidewall semiconductor surface, and is in direct physical contact with the outer sidewall semiconductor surface.

2. The semiconductor device in accordance with claim 1 wherein the semiconductor device structure further comprises a transistor structure including a source and a drain, and the silicide portion corresponds to the source or the drain.

3. A semiconductor device comprising:
a semiconductor device structure comprising a silicide portion having a top silicide surface and an outer sidewall silicide surface and a portion of silicon material overlying a buried oxide layer; and
an electrically conductive contact, wherein the contact includes two or more contact fingers, and wherein each of the two or more contact fingers is electrically connected directly to the top silicide surface, is in direct physical contact with the top silicide surface, is electrically connected directly to the outer sidewall silicide surface, is in direct physical contact with the outer sidewall silicide surface, is electrically connected directly to an outer sidewall surface of the portion of silicon material, and is in direct physical contact with the outer sidewall surface of the portion of silicon material, wherein the outer sidewall silicide surface and the outer sidewall surface of the portion of silicon material are common and continuous with each other.

4. The semiconductor device in accordance with claim 3 wherein the contact further includes intermediate portions thereof between each of the two or more contact fingers.

5. The semiconductor device in accordance with claim 3, further comprising two or more trenches formed in the portion of silicon material in a direction substantially perpendicular to a longitudinal axis of the semiconductor device structure, wherein the two or more contact fingers extend into the two or more trenches.

* * * * *